United States Patent
Rode et al.

(10) Patent No.: US 8,816,585 B2
(45) Date of Patent: Aug. 26, 2014

(54) LIGHT-EMITTING DIODE ARRANGEMENT HAVING A PIEZO TRANSFORMER

(75) Inventors: Patrick Rode, Regensburg (DE); Norwin von Malm, Nittendorf (DE); Lutz Höppel, Alteglofsheim (DE)

(73) Assignee: OSRAM Opto Semiconductors GmbH (DE)

( * ) Notice: Subject to any disclaimer, the term of this patent is extended or adjusted under 35 U.S.C. 154(b) by 71 days.

(21) Appl. No.: 13/820,181

(22) PCT Filed: Aug. 24, 2011

(86) PCT No.: PCT/EP2011/064550
§ 371 (c)(1),
(2), (4) Date: May 1, 2013

(87) PCT Pub. No.: WO2012/028509
PCT Pub. Date: Mar. 8, 2012

(65) Prior Publication Data
US 2014/0145610 A1     May 29, 2014

(30) Foreign Application Priority Data
Sep. 3, 2010   (DE) .................. 10 2010 036 251

(51) Int. Cl.
| | | |
|---|---|---|
| H01J 7/44 | (2006.01) |
| H01J 13/46 | (2006.01) |
| H01J 17/34 | (2006.01) |
| H01J 19/78 | (2006.01) |
| H01J 23/16 | (2006.01) |
| H01J 29/96 | (2006.01) |
| H01K 1/62 | (2006.01) |
| F21V 23/02 | (2006.01) |
| F21V 7/00 | (2006.01) |
| H01L 41/107 | (2006.01) |
| F21K 99/00 | (2010.01) |
| F21Y 101/02 | (2006.01) |

(52) U.S. Cl.
CPC ............... *F21K 9/50* (2013.01); *F21V 23/023* (2013.01); *F21V 7/00* (2013.01); *H01L 41/107* (2013.01); *F21Y 2101/02* (2013.01); *F21V 23/02* (2013.01)
USPC ........................... 315/70; 315/254; 315/276

(58) Field of Classification Search
None
See application file for complete search history.

(56) References Cited

U.S. PATENT DOCUMENTS

2006/0274531 A1* 12/2006 Kopf et al. .................. 362/294
2007/0024254 A1  2/2007 Radecker et al.
2011/0018458 A1* 1/2011 Wei .............................. 315/276

FOREIGN PATENT DOCUMENTS

| DE | 100 25 028 A1 | 2/2001 |
| DE | 10 2006 022 819 A1 | 1/2007 |
| DE | 10 2010 013 494 A1 | 10/2011 |
| DK | 176870 B1 | 2/2010 |
| EP | 1 729 059 A2 | 12/2006 |
| JP | 2003-86006 | 3/2003 |
| WO | 2010/097407 A1 | 9/2010 |

* cited by examiner

Primary Examiner — Anh Tran
(74) Attorney, Agent, or Firm — DLA Piper LLP (US)

(57) ABSTRACT

A light-emitting diode arrangement has a frame-shaped piezo transformer having at least one output-side connection, and having a light-emitting diode module that generates electromagnetic radiation, which module is disposed within the frame-shaped piezo transformer and electrically connects to the output-side connection of the piezo transformer by at least one output-side electrical conductor, wherein radiation emitted by the light-emitting diode module in the direction of the piezo transformer is reflected at the latter.

19 Claims, 3 Drawing Sheets

LIGHT-EMITTING DIODE ARRANGEMENT HAVING A PIEZO TRANSFORMER

RELATED APPLICATIONS

This is a §371 of International Application No. PCT/EP2011/064550, with an international filing date of Aug. 24, 2011 (WO 2012/028509 A1, published Mar. 8, 2012), which is based on German Patent Application No. 10 2010 036 251.4 filed Sep. 3, 2010, the subject matter of which is incorporated herein by reference.

TECHNICAL FIELD

This disclosure relates to a light-emitting diode arrangement having a piezo transformer. An available supply voltage can be transformed into a voltage with the piezo transformer which is suitable to operate one or a plurality of light-emitting diode chips. This type of light-emitting diode arrangement having an integrated piezo transformer permits a space-saving construction.

BACKGROUND

A light-emitting diode arrangement having a piezo transformer and a plurality of light-emitting diodes is described e.g. in DK 176870 B1. As shown in FIG. 2 of DK '870, the light-emitting diodes can be disposed on an outer-lying surface of the piezo transformer. In that case, the light-emitting diodes are subjected to mechanical loads from the outside and on account of the oscillation of the piezo transformer.

It could therefore be helpful to provide an improved light-emitting diode arrangement having a compact construction.

SUMMARY

We provide a light emitting diode arrangement including a frame-shaped piezo transformer having at least one output-side connection, and a light-emitting diode module that generates electromagnetic radiation, which module is disposed within the frame-shaped piezo transformer and electrically connects to the output-side connection of the piezo transformer by at least one output-side electrical conductor, wherein radiation emitted by the light-emitting diode module in the direction of the piezo transformer is reflected at the latter.

DETAILED DESCRIPTION

Figure 1:
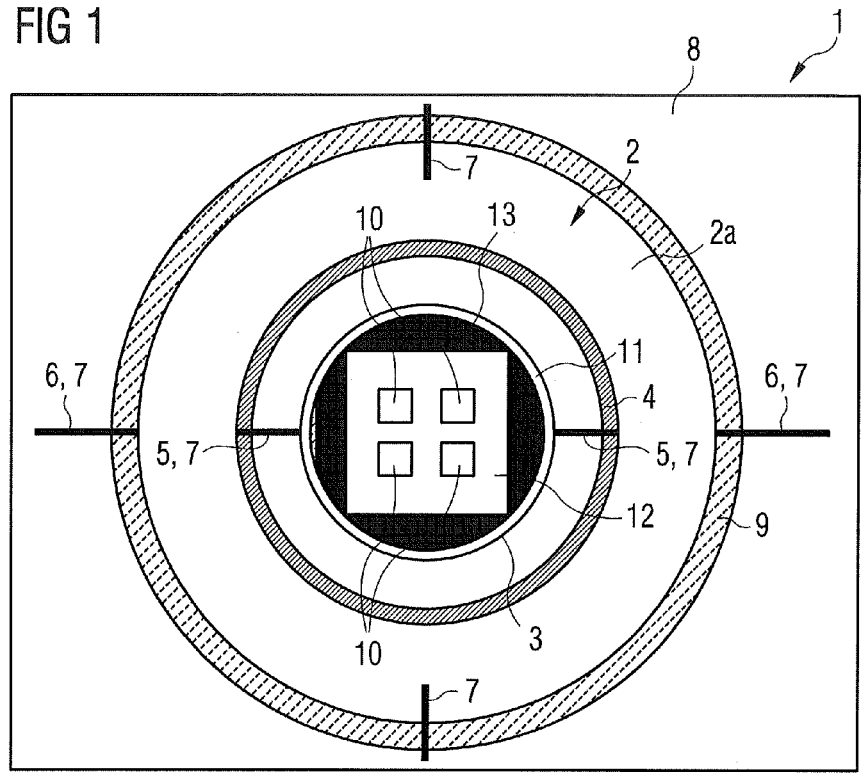
FIGS. 1 and 2 show a schematic plan view and a schematic side view of a first example of a light-emitting diode arrangement.

Preferably, the light-emitting diode arrangement comprises a frame-shaped piezo transformer and a light-emitting diode module that generates electromagnetic radiation, which module is disposed within the frame-shaped piezo transformer. The piezo transformer advantageously has at least one output-side connection. The light-emitting diode module electrically connects to the output-side connection of the piezo transformer by at least one output-side electrical conductor. Advantageously, the radiation emitted by the light-emitting diode module in the direction of the piezo transformer is reflected at the latter.

The piezo transformer can achieve a reflectivity of in particular more than 80% or more than 90%, preferably more than 94%. Preferably, this reflectivity is achieved for electromagnetic radiation in the visible spectral range. This reflectivity is then achieved in particular for the radiation emitted by the light-emitting diode module in the direction of the piezo transformer.

The piezo transformer thus serves not only as a voltage transformer, but forms at the same time a reflector. Preferably, the piezo transformer diverts the radiation emitted by the light-emitting diode module and impinges upon the piezo transformer into a main emission cone.

The frame-shaped configuration is understood in particular to mean that the piezo transformer has an opening at least partially surrounded in the lateral direction by the material of the piezo transformer. Preferably, the opening is completely surrounded by the material of the piezo transformer.

The light-emitting diode module of the light-emitting diode arrangement is advantageously disposed in this opening. In particular, at least a part of the light-emitting diode module is laterally enclosed by the piezo transformer. Therefore, radiation emitted laterally by the light-emitting diode module is diverted into a main emission cone disposed preferably along the opening in a symmetrical manner.

Preferably, the piezo transformer has a rotationally symmetrical shape. For example, the piezo transformer can have a circular contour. The piezo transformer can be formed as a hollow cylinder. However, it is also feasible for the piezo transformer to have a rectangular contour.

The piezo transformer contains or consists of at least one ceramic material. In particular, the piezo transformer can contain a lead-zirconate-titanate (PZT) as the ceramic material. Furthermore, it is possible for the piezo transformer to be free of heavy metals. Piezo transformers are described e.g. in DK 176870 B1 and US 2007/0024254 A1, the subject matter of which is hereby incorporated by reference.

At the at least one output-side connection, the piezo transformer provides electrical current and voltage to operate the light-emitting diode module. The piezo transformer can comprise more than one output-side contact point.

Advantageously, the piezo transformer may have, on a surface facing towards the light-emitting diode module, a reflection means that reflects radiation emitted by the light-emitting diode module in the direction of the piezo transformer.

Preferably, the reflection means is applied at least partially to the surface of the e.g. ceramic base body of the piezo transformer. For example, the reflection means can be a reflective layer applied at least partially to the surface of the base body of the piezo transformer.

Advantageously, the reflection means may contain a metal or a metal compound. For example, a coating which contains a metal or a metal compound can be applied at least partially to the surface of the base body of the piezo transformer.

The reflection means may contain a dielectric material. In particular, the dielectric material can be a silicon oxide and/or a titanium oxide or a combination of these or further dielectric materials. For example, the dielectric material or the combination of dielectric materials can be applied as a coating or coatings at least partially to the surface of the base body of the piezo transformer.

Furthermore, it is possible for the reflection means to be disposed in an intermediate space between the base body of the piezo transformer and the light-emitting diode module.

In particular, the reflection means can fill this intermediate space.

The reflection means may be a reflective filler material. The reflective filler material is preferably a polymer into which reflective particles are introduced. The polymer of the filler material which forms a matrix for the particles is e.g. a silicone, an epoxide or a silicone-epoxide hybrid material. The reflective particles are produced from or consist of e.g. a metal oxide such as aluminium oxide or titanium oxide, a metal fluoride such as calcium fluoride or a silicon oxide.

For example, the intermediate space between the base body of the piezo transformer and the light-emitting diode module can be filled with a reflective filler material such that the light-emitting diode module is enclosed at least laterally by the reflective filler material. Therefore, the light-emitting diode module can be protected by the reflective filler material.

The light-emitting diode arrangement may have a main connection carrier having a mounting surface on which the light-emitting diode module and the piezo transformer are disposed. The main connection carrier is e.g. a conductor board such as a printed circuit board or a metal core board. The main connection carrier comprises e.g. an electrically insulating base body. Conductor paths and/or electrical contact points are structured into and/or onto the insulating base body. Furthermore, the mounting surface advantageously has a reflective sub-region, on which the light-emitting diode module is disposed. The radiation emitted by the light-emitting diode module in the direction of the mounting surface can be diverted by the reflective sub-region into the main emission cone. As a consequence, the radiation power of the light-emitting diode arrangement can be improved.

Preferably, the light-emitting diode arrangement has at least one oscillation-damping connection element. The oscillation-damping connection element can be used to counteract a transfer of the oscillation of the piezo transformer to other elements of the light-emitting diode arrangement.

The piezo transformer may be attached to the main connection carrier by the oscillation-damping connection element. As a consequence, a transfer of the oscillation of the piezo transformer to the main connection carrier can be counteracted.

Preferably, the piezo transformer is held on the main connection carrier only by one or a plurality of oscillation-damping connection elements, that is to say a further attachment means is not provided. Therefore, the piezo transformer is substantially mechanically decoupled from the main connection carrier. In this manner, mechanical damage to the piezo transformer or to the main connection carrier can be prevented.

The light-emitting diode arrangement preferably has at least one input-side electrical conductor with which the piezo transformer electrically connects to at least one input-side connection. Typically, the mains voltage is applied to the input-side connection of the piezo transformer.

Preferably, the at least one oscillation-damping connection element forms the at least one input-side electrical conductor with which the piezo transformer electrically connects to the input-side connection. Expediently, the oscillation-damping connection element contains in this case an electrically conductive material.

The at least one oscillation-damping connection element advantageously contains a metal or a metal compound. For example, the at least one oscillation-damping connection element can contain, or consist of, gold.

Preferably, the at least one oscillation-damping connection element is attached at one end to an outer surface of the piezo transformer and attached at the other end to the mounting surface of the main connection carrier.

The light-emitting diode module may mechanically connect to the piezo transformer by at least one oscillation-damping connection element. Therefore, a transfer of oscillations from the piezo transformer to the light-emitting diode module can be counteracted and a mechanical loading of the light-emitting diode module by virtue of the oscillation of the piezo transformer can be reduced.

Preferably, the at least one oscillation-damping connection element forms between the piezo transformer and the light-emitting diode module the at least one output-side electrical conductor with which the light-emitting diode module electrically connects to the output-side connection of the piezo transformer.

In addition to the arrangement of the light-emitting diode module within the frame-shaped piezo transformer, the dual function of the connection element as an oscillation-damping means and electrical conductor also contributes to an advantageously compact design. At the same time, the light-emitting diode module is comparatively well protected against external effects by the surrounding frame-shaped piezo transformer and is comparatively well protected against mechanical loads by the at least one oscillation-damping connection element.

The light-emitting diode arrangement can be produced with a low installation height of at the most 10 mm, in particular of at the most 4 mm.

The light-emitting diode module can have at least one light-emitting diode chip for the purpose of generating the electromagnetic radiation, in particular electromagnetic radiation in the visible spectral range. This can be a commercially available light-emitting diode semiconductor chip which comprises an active region which generates radiation, and/or at which during operation there is a voltage drop of less than 4 V.

Furthermore, the at least one light-emitting diode chip can be a high-voltage light-emitting diode chip. A high-voltage light-emitting diode chip may be a light-emitting diode chip comprising at least two active regions connected together in series. Each of the active regions may be provided during operation of the high-voltage light-emitting diode chip that generates electromagnetic radiation. The active regions can be stacked vertically one on top of the other and/or can be disposed laterally one next to the other.

At the high-voltage light-emitting diode chip there is a voltage drop of at least 4 V. For example, at the high-voltage light-emitting diode chip there is a voltage drop of 10, 12, 24, 90, 110 or 230 V. The high-voltage light-emitting diode chip can thus be operated with a relatively high voltage.

In the light-emitting diode arrangement, the high-voltage light-emitting diode chip can be operated with alternating voltage. A high-voltage light-emitting diode chip which can be operated with alternating voltage can be achieved e.g. by virtue of the fact that a first group of active regions of the high-voltage light-emitting diode chip connects together in series and that a second group of active regions of the high-voltage light-emitting diode chip connects together in series, wherein the first group connects in anti-parallel fashion with respect to the second group.

If the light-emitting diode chip of the light-emitting diode module cannot be operated with alternating voltage, the light-emitting diode module preferably comprises at least one rectifier connected upstream or downstream of the piezo transformer.

The light-emitting diode chip can emit single-color radiation or mixed-color radiation, e.g. white light. If the light-emitting diode module comprises more than one light-emitting diode chip, the various light-emitting diode chips can generate in particular radiation of a different wavelength so that overall the light-emitting diode module emits mixed-color radiation.

The light-emitting diode module may have a module carrier having a mounting surface to mount the at least one light-emitting diode chip. The light-emitting diode chip can be applied as an unhoused chip directly onto the mounting surface. Furthermore, it is possible for the light-emitting diode chip to be disposed within a housing body, wherein the housing body is attached on the mounting surface.

Preferably, the mounting surface of the module carrier is at least partially reflective. That is to say, the module carrier may have a reflective sub-region. In particular, the at least one light-emitting diode chip may be disposed on the reflective sub-region. This can improve the radiation power of the light-emitting diode arrangement.

Preferably, the light-emitting diode arrangement, in particular the light-emitting diode module, has an optical element. Particularly preferably, the optical element is disposed downstream of the at least one light-emitting diode chip in the emission direction and diverts in particular at least some of the impinging radiation in the direction of the piezo transformer. The optical element can improve e.g. the coupling-out of light, influence the light distribution or used to bundle light. At the same time, the optical element can also be used as a cover and protection for the at least one light-emitting diode chip. In particular, the optical element is a lens.

Furthermore, the light-emitting diode arrangement preferably comprises electronic components that operate the light-emitting diode module. The electronic components are distributed on the main connection carrier and/or the module carrier.

The light-emitting diode arrangement may be used for various illumination systems. It is feasible to use the light-emitting diode arrangement as a lighting means in a ceiling lamp or desk lamp. Furthermore, the light-emitting diode arrangement can be used as a lighting means on the underside of pieces of furniture, e.g. as a bottom section lamp on a wall cupboard. The low installation height of the light-emitting diode arrangement means that comparatively flat illumination systems can be produced.

The light-emitting diode arrangement described in this case will be explained in greater detail hereinafter with reference to examples and the associated Figures.

Like or similar elements or elements acting in an identical manner are provided with the same reference numerals in the Figures.

FIG. 1 shows a plan view of a light-emitting diode arrangement 1 comprising a frame-shaped piezo transformer 2 and a light-emitting diode module 3 disposed within the piezo transformer 2 to generate electromagnetic radiation.

The piezo transformer 2 reflects radiation emitted by the light-emitting diode module 3 in the direction of the piezo transformer 2. The piezo transformer 2 is formed as a hollow cylinder and has in its interior an opening (not designated), in which the light-emitting diode module 3 is disposed. The light-emitting diode module 3 is thus completely laterally enclosed by the piezo transformer 2. In this case, the radiation emitted laterally by the light-emitting diode module 3 impinges in all directions upon the piezo transformer 2 and can thereby be reflected. In particular, the reflected radiation can be diverted by the piezo transformer 2 into a main emission cone disposed along the opening in a symmetrical manner.

In the case of the example illustrated in FIG. 1, the piezo transformer 2 has a reflection means 4 that reflects the impinging radiation. The reflection means 4 is disposed on a surface of a base body 2a of the piezo transformer 2 facing towards the light-emitting diode module 3. In particular, the reflection means 4 is applied as a coating all around the surface. The reflection means 4 can be a metallic mirror and can contain or consist of a metal or a metal compound. Furthermore, the reflection means 4 can be a dielectric mirror and can contain or consist of a dielectric material or a combination of dielectric materials such as a silicon oxide and/or a titanium oxide.

A reflectivity of in particular more than 80% or of more than 90%, preferably of more than 94% can be achieved with the piezo transformer 2.

The base body 2a of the piezo transformer 2 can be formed with a ceramic material as described above.

The piezo transformer 2 has two output-side electrical connections (50, 51 cf. FIG. 2) and two electrical connection parts (not designated). An output-side electrical conductor 5 is disposed in each case at each contact point. With the two output-side electrical conductors 5, the light-emitting diode module 3 electrically connects to the output-side connections of the piezo transformer 2 and can thus be supplied with a suitable voltage and a suitable current.

Furthermore, the electrical conductors 5 are oscillation-damping. They are used as oscillation-damping connection elements 7 between the piezo transformer 2 and the light-emitting diode module 3. The two electrical conductors 5 are disposed on two opposite sides of the light-emitting diode module 3.

The oscillation-damping connection elements 7 can be used to counteract a transfer of oscillations from the piezo transformer 2 to the light-emitting diode module 3 and a mechanical loading of the light-emitting diode module 3 by virtue of the oscillation of the piezo transformer 2 can be reduced.

Furthermore, the light-emitting diode arrangement 1 illustrated in FIG. 1 has a main connection carrier 8 having a mounting surface (not designated) on which the light-emitting diode module 3 and the piezo transformer 2 are disposed.

The main connection carrier 8 is e.g. a conductor board such as a printed circuit board or a metal core board. The main connection carrier 8 comprises in particular electronic components (not shown) to operate the piezo transformer 2 and/or the light-emitting diode module 3.

The mounting surface of the main connection carrier 8 has a reflective sub-region 9 on which the piezo transformer 2 and the light-emitting diode module 3 are disposed. The reflective sub-region 9 is adapted to the shape of the piezo transformer 2 and has a circular contour. The radiation emitted by the light-emitting diode module 3 in the direction of the mounting surface can be diverted by the reflective sub-region 9 into the main emission cone.

The light-emitting diode module 3 is fixedly attached on the main connection carrier 8. For example, the light-emitting diode module 3 can be adhered or bonded at its underside to the main connection carrier 8.

In contrast, the piezo transformer 2 is attached to the main connection carrier 8 by oscillation-damping connection elements 7. At its underside, the piezo transformer 2 lies preferably in a movable manner on the mounting surface of the main connection carrier 8. In the case of the example of the light-emitting diode arrangement 1 illustrated in FIG. 1, the piezo transformer 2 is attached to the main connection carrier 8 by four oscillation-damping connection elements 7. They permit oscillations in the vertical direction, that is to say perpendicularly with respect to the main connection carrier 8, as well as in the radial direction. The oscillation-damping connection elements 7 are disposed on different sides of the light-emitting diode module 3.

Two of the oscillation-damping connection elements 7 are used as input-side electrical conductors 6 disposed on two input-side contact points (not designated) of the piezo transformer 2. With the input-side electrical conductors 6, the piezo transformer 2 electrically connects to two input-side connections (60, 61 cf. FIG. 2). Typically, the mains voltage, that is to say in particular 230 V, is applied to the two input-side connections of the piezo transformer 2.

In the case of this example, the oscillation-damping connection elements 7 are advantageously formed from an electrically conductive material. In particular, the oscillation-damping connection elements 7 contain or consist of a metal or a metal compound. For example, the connection elements 7 can be formed from gold.

In the case of the light-emitting diode arrangement 1 illustrated in FIG. 1, the light-emitting diode module 3 has a plurality of light-emitting diode chips 10 that generate electromagnetic radiation. The light-emitting diode chips 10 are unhoused, that is to say they do not have a housing body. The light-emitting diode chips 10 can each emit mixed-color radiation or same-color radiation. Furthermore, the light-emitting diode chips 10 can emit different-color radiation so that overall the mixed-color radiation produces e.g. white light.

The light-emitting diode chips 10 can be conventional light-emitting diode chips or high-voltage light-emitting diode chips which can be operated with direct voltage or alternating voltage.

The light-emitting diode module 3 comprises a module carrier 11 having a mounting surface (not designated) on which the light-emitting diode chips 10 are applied. The module carrier 11 is adapted to the shape of the piezo transformer 2 and likewise has a circular contour. The mounting surface is reflective in a sub-region 13 where the light-emitting diode chips 10 are located. As a consequence, the radiation power of the light-emitting diode module 3 can be improved.

Furthermore, the light-emitting diode module 3 comprises an optical element 12 disposed downstream of the light-emitting diode chips 10 in the emission direction. It is disposed, like the light-emitting diode chips 10, in the opening of the piezo transformer 2.

The optical element 12 diverts in particular at least some of the radiation in the direction of the piezo transformer 2. Furthermore, the radiation can be bundled by the optical element 12 formed as a lens. The optical element 12 covers the light-emitting diode chips 10, wherein the light-emitting diode chips 10 are embedded into the optical element 12, and protects them against external effects.

Figure 2:
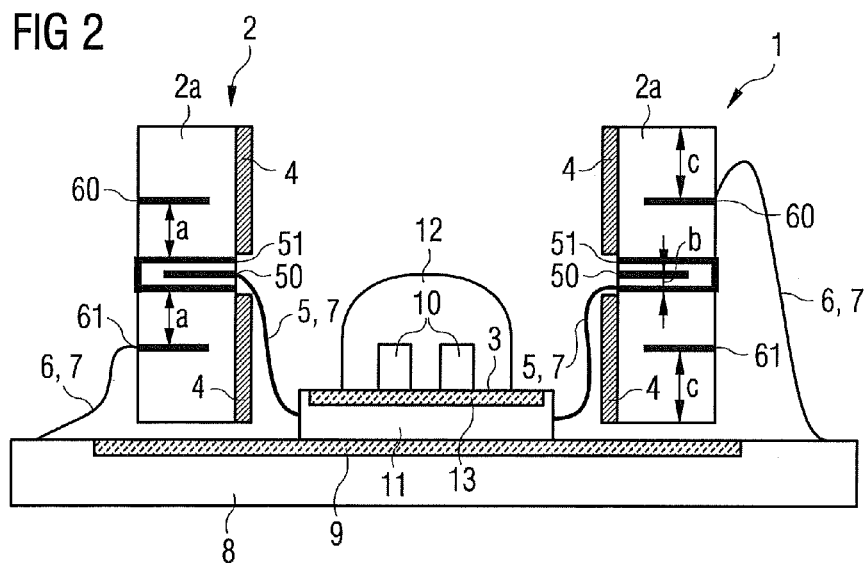

The light-emitting diode arrangement 1 illustrated in FIG. 1 is illustrated in FIG. 2 in a side view.

As can be seen in FIG. 2, the piezo transformer 2 has two input-side connections 60, 61 which on an outer surface of the base body 2a of the piezo transformer 2 are not covered by the material of the piezo transformer 2. On the outer surface, the two input-side connections 60, 61 are each connected to an input-side electrical conductor 6, 7 so that the piezo transformer 2 can be electrically supplied. Furthermore, the two input-side electrical conductors 6, 7 are attached to the mounting surface of the main connection carrier 8.

Furthermore, the piezo transformer 2 has two output-side connections 50, 51 which on an inner surface of the base body 2a of the piezo transformer 2 facing towards the light-emitting diode module 3 are not covered by the material of the piezo transformer 2. On the inner surface, the two output-side connections 50, 51 each connect to an output-side electrical conductor 5, 7, wherein the two output-side electrical conductors 5, 7 are guided to the light-emitting diode module 3 and connect thereto. Therefore, the light-emitting diode module 3 can be electrically supplied with the voltage converted by the piezo transformer 2.

The two input-side electrical connections 60, 61 are disposed above and below the two output-side connections 50, 51. Furthermore, one output-side connection 50 is embraced by the other output-side connection 51.

As shown in FIG. 2, the piezo transformer 2 protrudes beyond the light-emitting diode module 3 in terms of its height. The height of the piezo transformer 2 is relevant for the installation height of the light-emitting diode arrangement 1.

For example, the vertical distance a between in each case an input-side connection 60, 61 and the embracing output-side connection 51 can be a=1 mm. Moreover, the vertical distance b between the embracing output-side connection 51 and the embraced output-side connection 50 can be b=0.1 mm. Furthermore, the vertical distance c between in each case an input-side connection 60, 61 and the edge of the piezo transformer 2 can be c=0.95 mm. The diameter of the piezo transformer 2 can be 10 mm to 1 cm.

The reflection means 4 covers the inner surface of the base body 2a of the piezo transformer 2, wherein a sub-region remains free for attachment of the output-side electrical conductors 5, 7.

Figure 3:
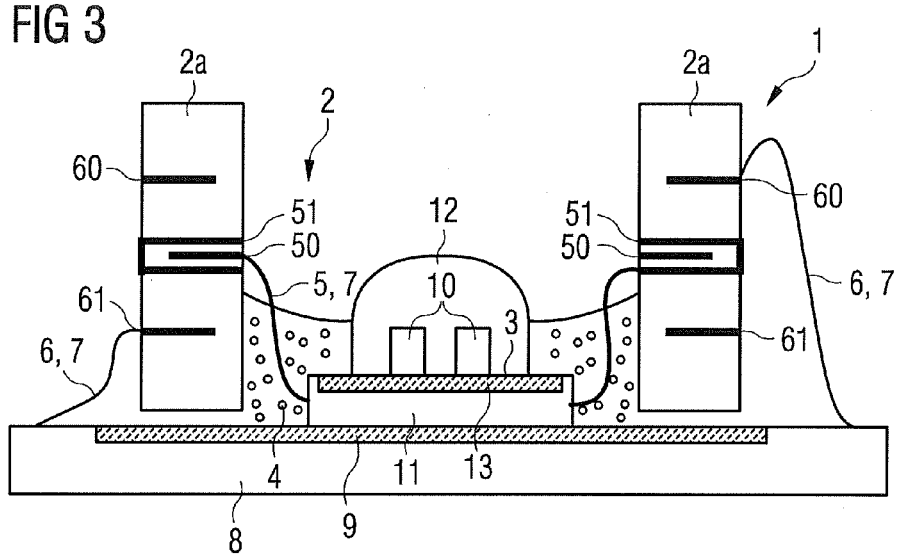
FIG. 3 shows a schematic side view of a second example of a light-emitting diode arrangement.

FIG. 3 shows a further example of a preferred light-emitting diode arrangement 1. It is constructed, with the exception of the reflection means 4, like the light-emitting diode arrangement 1 illustrated in FIGS. 1 and 2. However, in this case the reflection means 4 is not a reflective coating, but rather a reflective filler material disposed in an intermediate space between the base body 2a of the piezo transformer 2 and the light-emitting diode module 3. The reflection means 4 laterally encloses the light-emitting diode module 3 and comes up to the inner surface of the piezo transformer 2.

The filler material is a polymer into which reflective particles are introduced. The polymer of the filler material forming a matrix for the particles is e.g. a silicone, an epoxide or a silicone-epoxide hybrid material. The reflective particles are produced from or consist of e.g. a metal oxide such as aluminium oxide or titanium oxide, a metal fluoride such as calcium fluoride, or a silicon oxide. The filler material reflects in a diffuse manner. To an observer, the filler material appears in particular white.

As an alternative or in addition to a reflection means 4, the base body 2a of the piezo transformer 2 can itself be reflective. For this purpose, e.g. the above-described reflective particles can be introduced into the material of the base body 2a.

Figure 4:
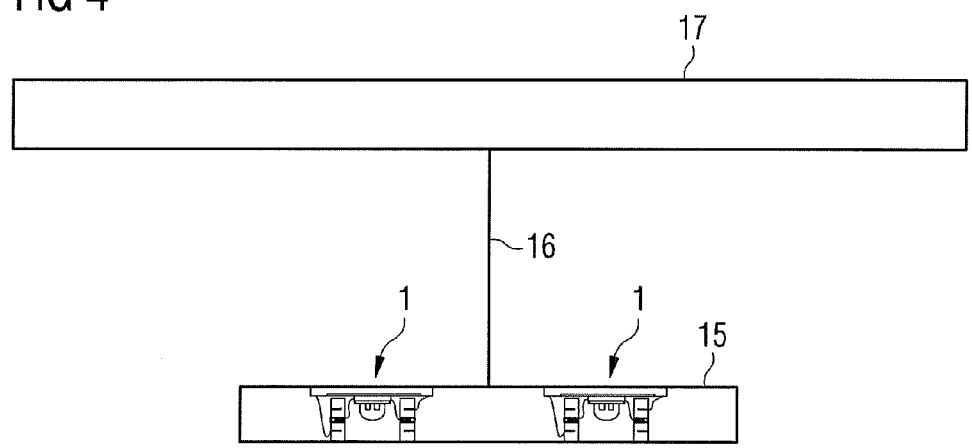
FIGS. 4, 5 and 6 show schematic views of various examples of an illumination system having at least one light-emitting diode arrangement.

FIG. 4 illustrates a first example of an illumination system 15. The illumination system 15 is a ceiling lamp which as a lighting means has two of the light-emitting diode arrangements 1. The ceiling lamp is attached to a ceiling 17 by a cable 16 which serves as a suspension. The emission of the light-emitting diode arrangements 1 is effected downwardly, that is to say away from the ceiling 17. The low installation height of the light-emitting diode arrangements 1 means that the ceiling lamp can be flat in design.

Figure 5:
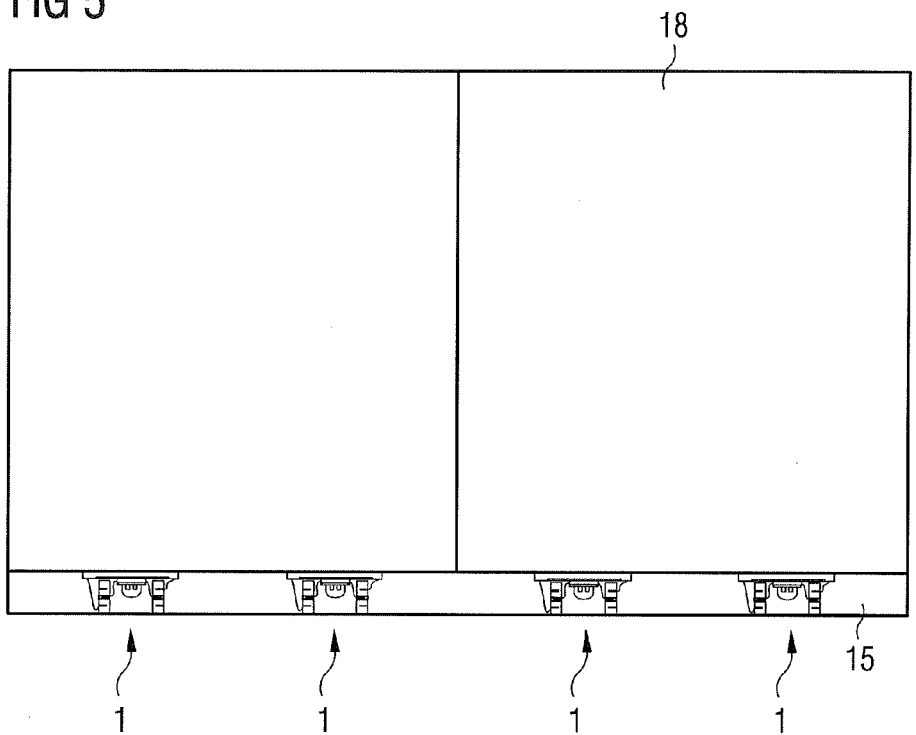

A second example of an illumination system 15 is illustrated in FIG. 5. The illumination system 15 is a bottom section lamp attached to a piece of furniture 18, e.g. a wall cupboard and emits light freely into the room. As a lighting means, the illumination system 15 has a plurality of light-emitting diode arrangements 1. By reason of the low installation height of the light-emitting diode arrangements 1, the bottom section lamp can also advantageously be flat in design.

Figure 6:
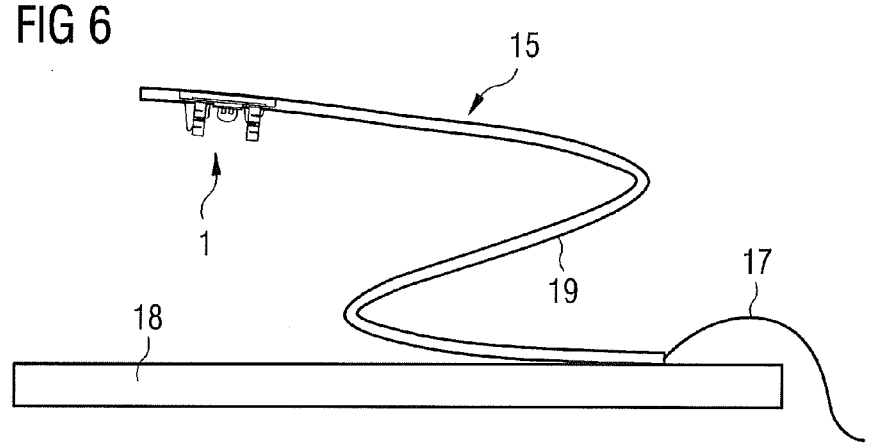

FIG. 6 shows a third example of an illumination system 15. In this case, the illumination system 15 is a floor lamp to illuminate a piece of furniture 18. For example, the illumination system 15 is a desk lamp to illuminate a desk. The lighting means can be a light-emitting diode arrangement 1 integrated in a lamp holder 19. The lamp holder 19 can be formed e.g. of metal or synthetic material. As an extension of the lamp holder 19, a cable 17 is provided for electrical connection of the illumination system 15. In this example, it is not only the low installation height which proves to be advantageous. The low weight of the light-emitting diode arrangement 1, also caused by the low weight of the piezo transformer (in particular about 6 g) is also advantageous in a floor lamp. As a consequence, the illumination system 15 can be designed to be ductile without any problem.

Our arrangements are not limited by the description using the examples. Rather, this disclosure includes any new feature and any combination of features included in particular in any combination of features in the appended claims, even if the feature or combination itself is not explicitly stated in the claims or examples.

The invention claimed is:

1. Light emitting diode arrangement comprising:
    a frame-shaped piezo transformer having at least one output-side connection, and
    a light-emitting diode module that generates electromagnetic radiation, which module is disposed within the frame-shaped piezo transformer and electrically connects to the output-side connection of the piezo transformer by at least one output-side electrical conductor, wherein radiation emitted by the light-emitting diode module in the direction of the piezo transformer is reflected at the latter.

2. The light-emitting diode arrangement according to claim 1, wherein the piezo transformer has, on a surface facing toward the light-emitting diode module, a reflector that reflects the radiation emitted by the light-emitting diode module toward the piezo transformer.

3. The light-emitting diode arrangement according to claim 2, wherein the reflector contains a metal or a metal compound.

4. The light-emitting diode arrangement according to claim 2, wherein the reflector contains a dielectric material.

5. The light-emitting diode arrangement according to claim 1, further comprising a main connection carrier having a mounting surface on which the light-emitting diode module and the piezo transformer are disposed.

6. The light-emitting diode arrangement according to claim 5, wherein the mounting surface has a reflective sub-region on which the light-emitting diode module is disposed.

7. The light-emitting diode arrangement according to claim 5, further comprising at least one oscillation-damping connection element.

8. The light-emitting diode arrangement according to claim 7, wherein the piezo transformer is attached to the main connection carrier by the oscillation-damping connection element.

9. The light-emitting diode arrangement according to claim 1, further comprising at least one input-side electrical conductor with which the piezo transformer electrically connects to an input-side connection.

10. The light-emitting diode arrangement according to claim 8, wherein the at least one oscillation-damping connection element forms the at least one input-side electrical conductor with which the piezo transformer electrically connects to the input-side connection.

11. The light-emitting diode arrangement according to claim 1, wherein the light-emitting diode module mechanically connects to the piezo transformer by at least one oscillation-damping connection element.

12. The light-emitting diode arrangement according to claim 11, wherein the at least one oscillation-damping connection element forms the at least one output-side electrical conductor with which the light-emitting diode module electrically connects to the output-side connection of the piezo transformer.

13. The light-emitting diode arrangement according to claim 1, wherein the light-emitting diode module has a module carrier having a mounting surface to mount at least one light-emitting diode chip which is at least partially reflective.

14. The light-emitting diode arrangement according to claim 13, wherein the light-emitting diode module has an optical element disposed downstream of the light-emitting diode chip in an emission direction and diverts at least some of the radiation toward the piezo transformer.

15. The light-emitting diode arrangement according to claim 1, wherein the piezo transformer laterally encloses at least a part of the light-emitting diode module.

16. The light-emitting diode arrangement according to claim 1, wherein the piezo transformer has an opening at least partially surrounded in the lateral direction by a material of the piezo transformer.

17. The light-emitting diode arrangement according to claim 1, wherein the piezo transformer has a rotationally symmetrical shape.

18. The light-emitting diode arrangement according to claim 2, wherein the reflector is disposed in an intermediate space between the base body of the piezo transformer and the light-emitting diode module.

19. The light-emitting diode arrangement according to claim 9, wherein the at least one oscillation-damping connection element forms the at least one input-side electrical conductor with which the piezo transformer electrically connects to the input-side connection.

* * * * *